(12) United States Patent
Natume

(10) Patent No.: US 7,887,276 B2
(45) Date of Patent: Feb. 15, 2011

(54) LOAD PORT DEVICE

(75) Inventor: Mitsuo Natume, Aichi (JP)

(73) Assignee: Shinko Electric Co., Ltd., Tokyo (JP)

( * ) Notice: Subject to any disclaimer, the term of this patent is extended or adjusted under 35 U.S.C. 154(b) by 208 days.

(21) Appl. No.: 11/892,830

(22) Filed: Aug. 28, 2007

(65) Prior Publication Data

US 2008/0056860 A1    Mar. 6, 2008

(30) Foreign Application Priority Data

Aug. 28, 2006   (JP) .................... P2006-230357

(51) Int. Cl.
  B65G 49/07   (2006.01)
  B65G 1/06    (2006.01)
(52) U.S. Cl. ...................... 414/217; 414/940
(58) Field of Classification Search ............... 414/217, 414/411, 939, 940
  See application file for complete search history.

(56) References Cited

U.S. PATENT DOCUMENTS

| | | | |
|---|---|---|---|
| 5,303,482 A * | 4/1994 | Yamashita et al. | 34/80 |
| 5,464,313 A * | 11/1995 | Ohsawa | 414/172 |
| 5,741,109 A * | 4/1998 | Wiesler et al. | 414/416.08 |
| 5,788,447 A * | 8/1998 | Yonemitsu et al. | 414/217 |
| 6,013,920 A * | 1/2000 | Gordon et al. | 250/559.36 |
| 6,169,935 B1 * | 1/2001 | Iwasaki et al. | 700/214 |
| 6,398,476 B1 * | 6/2002 | Ando | 414/282 |
| 6,506,009 B1 * | 1/2003 | Nulman et al. | 414/217.1 |
| 6,726,429 B2 * | 4/2004 | Sackett et al. | 414/217 |
| 6,837,663 B2 * | 1/2005 | Mages et al. | 414/411 |
| 7,771,153 B2 * | 8/2010 | Doherty et al. | 414/331.02 |
| 2003/0099527 A1 * | 5/2003 | Mitsuyoshi | 414/217 |
| 2003/0156928 A1 * | 8/2003 | Sackett et al. | 414/217 |
| 2005/0063799 A1 * | 3/2005 | Larson et al. | 414/217 |
| 2005/0111943 A1 * | 5/2005 | Otaguro | 414/411 |
| 2006/0099054 A1 * | 5/2006 | Friedman et al. | 414/217 |
| 2010/0143082 A1 * | 6/2010 | Wang et al. | 414/222.02 |

FOREIGN PATENT DOCUMENTS

| | | |
|---|---|---|
| JP | 10-303271 | 11/1998 |
| JP | 2003-051527 | 2/2003 |

* cited by examiner

*Primary Examiner*—Charles A Fox
(74) *Attorney, Agent, or Firm*—Jean C. Edwards, Esq.; Akerman Senterfitt

(57) ABSTRACT

A mount base is adapted to be fixed to a partition wall which is disposed between a stockyard for temporarily storing a wafer carrier which houses a wafer and a wafer processing device for processing the wafer. A wafer transfer window is provided on the mount base. A carrier stage has a table horizontally extended from a lower edge of the wafer transfer window and a carrier plate disposed on the table so as to support the wafer carrier and movable so as to transfer the wafer carrier to the processing device. A buffer stage has a buffer plate horizontally disposed below the table so as to temporarily store the wafer carrier.

3 Claims, 9 Drawing Sheets

LOAD PORT DEVICE

The present application claims priority from Japanese Patent Application No. 2006-230357, filed on Aug. 28, 2006.

BACKGROUND

The present invention relates to a load port device that is disposed in front of a processing device for performing a wafer processing and that carries out an opening/closing operation of a cover of a wafer carrier and a sending/receiving operation of a wafer housed in the wafer carrier in a semiconductor fabrication apparatus.

Referring to the drawings according to the invention, first, a semiconductor fabrication apparatus (hereinafter, simply referred to as "a fabrication apparatus") and a front-end apparatus (hereinafter, referred to as "an EFEM") will be described, and subsequently a related-art load port device will be described. FIG. 7 is a longitudinal sectional view illustrating a fabrication apparatus. FIG. 9 is an overall perspective view illustrating a related-art load port device F'. In a semiconductor fabrication factory, a carrier conveyance system conveys a plurality of wafers W housed in a wafer carrier (hereinafter, simply referred to as "a carrier") 30 to facilities in production lines by a carrier unit. FOUP (Front Opening Unified Pod) is frequently used as the carrier. As shown in FIG. 7, a fabrication apparatus for receiving the wafer W by a carrier unit and performing a wafer processing includes the EFEM having a stockyard R1, and a processing device R3. The EFEM which includes an external load port L, the stockyard processing device R3. The EFEM which includes an external load port L, the stockyard R1 and an enclosure R2 is installed on the front side of the processing device R3. The carrier 30 that is conveyed from the carrier conveyance system and to be transferred to the stockyard R1 of the fabrication apparatus is placed on the external load port L. As shown in FIG. 7, the external load port L is placed outside the stockyard R1. In the stockyard R1, a plurality of carrier installation shelves S on which the carrier 30 is placed and a carrier transfer device T1 are disposed. Further, the enclosure R2 is a front chamber of the processing device R3. An FFU (Fan Filter Unit) and a wafer conveyance robot T2 are provided in the enclosure R2. In the enclosure R2, highly clean air is sent out by the FFU. Thus, the wafer W is prevented from being contaminated with particles before a wafer processing.

In the fabrication apparatus, the related-art load port device F' is an internal load port device that is mounted in the front side of a wall member P by means of a bolt 81 or the like, which isolates the stockyard R1 from the enclosure R2 that is a front chamber of the processing device R3. Hereinafter, the internal load port device will be called "a load port device" and distinguished from the external load port L. As shown in FIG. 9, the related-art load port device F' includes a mount base 1 that has a rectangular plate shape and is mounted on the wall member P, a wafer transfer window 2 that is provided on the mount base 1, and a carrier stage C that is disposed on a substantial lower end of the wafer transfer window 2 and places the carrier 30 thereon. The carrier stage C is disposed so as to be parallel to the stockyard R1 that is in a front side of the wall member P, and the front side is a front side of the load port device F'. In the same front side, an elevation mechanism U2 of a mapping device M for detecting an existence or non-existence of the wafer W housed in the carrier 30 in each stair is disposed below one side of the carrier stage C. The rear side of the load port device F' is disposed in the enclosure R2. In the same rear side, a cover opening/closing unit N for carrying out an opening/closing operation of a cover 32 of the carrier 30 by detaching and attaching the cover 32 therefrom and thereto, an elevation mechanism U1 of the cover opening/closing unit N, and the mapping device M are disposed. Further, a support member 1a is attached to both ends of the mount base 1.

When the carrier 30 housing the wafer W is conveyed to the fabrication apparatus, the carrier 30 is received in the external load port L and then temporarily stored in the stockyard R1 by the carrier transfer device T1. When a non-processed wafer W is supplied to the processing device R3 in accordance with a wafer processing status of the processing device R3, the carrier 30 stored in the stockyard R1 is first transferred onto a carrier plate 11 of the carrier stage C of the load port device F' by the transfer device T1, and then the carrier plate 11 moves toward the wafer transfer window 2. Subsequently, the cover 32 of the carrier 30 is opened by the cover opening/closing unit N of the load port device F' and then the wafer W in the carrier 30 is conveyed to the processing device R3 so as to perform a wafer processing thereon. After the wafer processing ends, the wafer W is again housed in the carrier 30 from the processing device R3, the cover 32 of the carrier 30 is closed, and then the carrier plate 11 moves away from the wafer transfer window 2. Subsequently, the carrier 30 is transferred from the carrier stage C to the external load port L or a carrier installation shelf S in the stockyard R1. The carrier 30 transferred to the external load port L is conveyed from the fabrication apparatus to proceed to the next process by the carrier conveyance system. The carrier 30 transferred to the carrier installation shelf S is also transferred to the external load port L at any time. Similarly, the carrier 30 is conveyed from the fabrication apparatus to proceed to the next process. The load port device F' for carrying out a sending operation of the carrier 30 and a receiving operation of the carrier 30 at the same time and the carrier transfer device T1 are disclosed in Patent Document 1. In addition, a carrier interface device including an open/close mechanism of the carrier 30 is disclosed, for example, in Patent Document 2.

In a case where the wafer W is supplied to the processing device R3 in accordance with the wafer processing status of the processing device R3, it is more effective in terms of cost and time to supply the carrier 30 temporarily stored in the stockyard R1 from the stockyard R1 to the processing device R3 on demand than to supply the carrier 30 housing the wafer W from outside to the fabrication apparatus on demand. In order to improve an operation rate of the fabrication apparatus and to process a lot of wafer W, it is necessary to ensure storing spaces as many as the number of the wafers W or storing spaces for the carriers 30 housing the wafer W. However, since the fabrication apparatus is in a clean room, it is not possible to arbitrarily increase storing spaces for the wafer W within a limited space of the clean room. For this reason, in the past, it was a task to increase a reception capacity of the wafer W in the clean room, particularly in the stockyard R1, that is, a reception capacity of the carrier.

Patent Document 1: Japanese Patent Publication No. 2003-51527A

Patent Document 2: Japanese Patent Publication No. 10-303271A

SUMMARY

It is therefore an object of the invention to increase a reception capacity of a wafer carrier in a stockyard of a semiconductor fabrication apparatus.

In order to achieve the above objects, according to an aspect of the invention, there is provided a load port device comprising:

a mount base adapted to be fixed to a partition wall which is disposed between a stockyard for temporarily storing a wafer carrier which houses a wafer and a wafer processing device for processing the wafer;

a wafer transfer window provided on the mount base;

a carrier stage having:

a table horizontally extended from a lower edge of the wafer transfer window; and a carrier plate disposed on the table so as to support the wafer carrier and movable so as to transfer the wafer carrier to the processing device; and a buffer stage having a buffer plate horizontally disposed below the table so as to temporarily store the wafer carrier.

As described above, since one of functions of the load port device is to open and close a cover of the wafer carrier placed on the carrier stage, the load port device was not used as a reception space of the wafer carrier. However, according to the aspect the invention, additional one wafer carrier can be placed thereon by mounting a buffer stage on the load port device, and thus a reception capacity of the wafer carrier in the stockyard increases. For this reason, the number of non-processed wafers supplied to the processing device increases. As a result, it is not necessary to convey the wafer carrier one by one by means of a conveyance system in order to supply the wafer carrier to the stockyard in the fabrication apparatus in accordance with a wafer processing status. Accordingly, a conveyance frequency can be decreased. Further, since the buffer stage is provided right below the table, a distance when transferring the wafer carrier from the buffer plate of the buffer stage to the carrier plate of the carrier stage is shorter than that when transferring the wafer carrier from a normal carrier installation shelf in the stockyard thereto. As a result, a transfer efficiency of the wafer carrier is improved. Accordingly, mounting the buffer stage on the load port device leads to an increase of an operation rate of the fabrication apparatus, an efficiency of a wafer processing and an improvement of a wafer production. In the load port device according to the aspect of the invention, since thickness of the carrier stage and depth of devices such as the elevation mechanism of the mapping device disposed below the carrier stage are smaller than those of a related-art load port device, a sufficient space in which the wafer carrier can be placed is ensured. Accordingly, the buffer stage can be mounted on the load port device according to the aspect of the invention.

The carrier plate may be movable between a first position and a second position which is nearer to the wafer transfer window than the first position;

the carrier plate may be provided with a plurality of first positioning pins operable to position the wafer carrier relative to the carrier plate and a first hand insertion space so as to prevent interference with a transfer hand of a carrier transfer device for transferring the wafer carrier by supporting the wafer carrier so as to attach and detach the wafer carrier to and from the carrier plate;

the buffer plate may be provided with a plurality of second positioning pins operable to position the wafer carrier relative to the buffer plate and a second hand insertion space so as to prevent interference with the transfer hand of the carrier transfer device; and when the carrier plate is positioned in the first position, the first positioning pins may be situated at the same position with the second positioning pins as viewed from the top and the first hand insertion space are situated at the same position with the second positioning pins as viewed from the top.

When the wafer carrier is transferred onto the carrier stage, the carrier plate is located at a maximum recession position from the transfer window of the load port device in reciprocation directions to and from the processing device. With the above-described configuration, the second positioning pins and the second hand insertion space formed on the buffer plate have the same configuration as the first positioning pins and the first hand insertion space formed on the carrier plate, and the second positioning pins and the second hand insertion space are disposed at the same positions as the first positioning pins and the first hand insertion space as viewed from the top in a case where the carrier plate is at the maximum recession position (the first position) from the wafer transfer window. As a result, when the wafer carrier is transferred from the buffer carrier plate onto the carrier plate at the recession position (the first position), an operation range in three dimension of the carrier transfer device can be simply set. That is, in the operation range of the transfer arm of the carrier transfer device, regarding a height direction, it is only necessary to set a distance between the buffer plate and the carrier plate at the first position. Regarding the reciprocation direction to and from the processing device, it is only necessary to set a distance between a point when the transfer arm of the carrier transfer device shortens to a maximum recession position from each of the plates and a position when the transfer arm lengthens to insert the transfer hand in the hand insertion space of each of the plates. A distance in a transverse direction perpendicular to the reciprocation directions can be set to a fixed value. As a result, the wafer carrier can be effectively transferred from the buffer stage to the carrier stage.

The buffer plate may be disposed substantially at the same height with a load port which is placed outside the stockyard.

The wafer carrier conveyed from the semiconductor fabrication apparatus by the carrier conveyance system is placed on a load port which is placed outside the stockyard. This load port is an external load port disposed on the most front side of the semiconductor fabrication apparatus. With the above-described configuration, when the wafer carrier is transferred from the external load port to the stockyard so as to temporarily store the wafer carrier, even though the transfer arm of the carrier transfer device is slightly lifted up in a height direction so as to fit the positioning pins of the buffer plate to positioning pedestals formed on the bottom surface of the wafer carrier, the wafer carrier is transferred to the buffer plate just by operating the transfer arm in the reciprocation direction relative to the processing device. For this reason, a transfer distance of the wafer carrier transferred to the buffer plate is shorter than that of the wafer carrier transferred to the carrier installation shelf in the stockyard. As a result, the wafer carrier can be effectively transferred to the stockyard.

The load port device may further comprises:

a mapping device;

an elevator disposed below the carrier stage and operable to move the mapping device in a vertical direction; and a cover covering the elevator.

With the above-described configuration, the cover is mounted below the carrier stage so as to cover the elevator of the mapping device. As a result, mounting the cover mounted below the carrier stage results in a good appearance of the load port device. Moreover, the wafer carrier is prevented from interfering with the elevator due to a malfunction or the like of the carrier transfer device, thereby protecting the wafer carrier and the elevator.

According to the invention, one additional wafer carrier can be placed on a load port device on which a buffer stage is mounted. For this reason, a reception capacity of a wafer carrier in a stockyard increases. Thus, it is not necessary to convey the wafer carrier one by one to the stockyard in a fabrication apparatus by a wafer carrier conveyance system in accordance with a wafer processing status. As a result, a transfer frequency can be decreased. In addition, since a buffer stage is formed right below a table, a transferring distance of the wafer carrier between the buffer plate of the buffer stage and the carrier plate of the carrier stage is shorter than that between a carrier installation shelf in the stockyard and the carrier plate. As a result, a transfer efficiency of the wafer carrier is improved. Therefore, mounting the buffer stage on the load port device leads to an increase of an operation rate of the fabrication apparatus, an efficiency of a wafer processing, and an improvement of a wafer production.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE EMBODIMENTS

Figure 1:
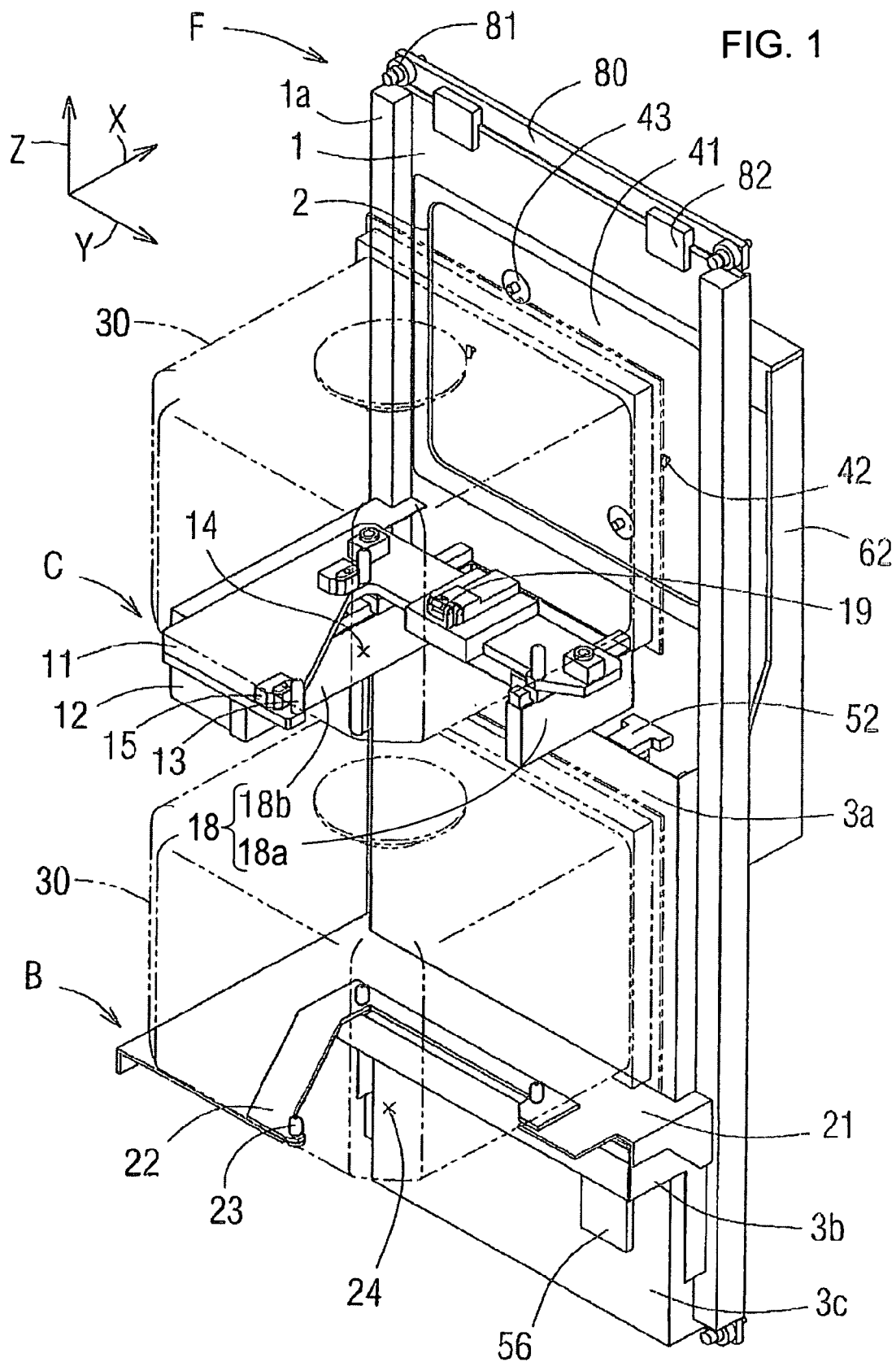
FIG. 1 is an overall perspective view illustrating a load port device F.

Hereinafter, an embodiment of the invention will be described in detail with reference to the drawings. In addition, the same reference numerals are given to the same components as those in BACKGROUND section. Repetitive explanations for those will be omitted and characteristics of the invention will be described.

Figure 2:
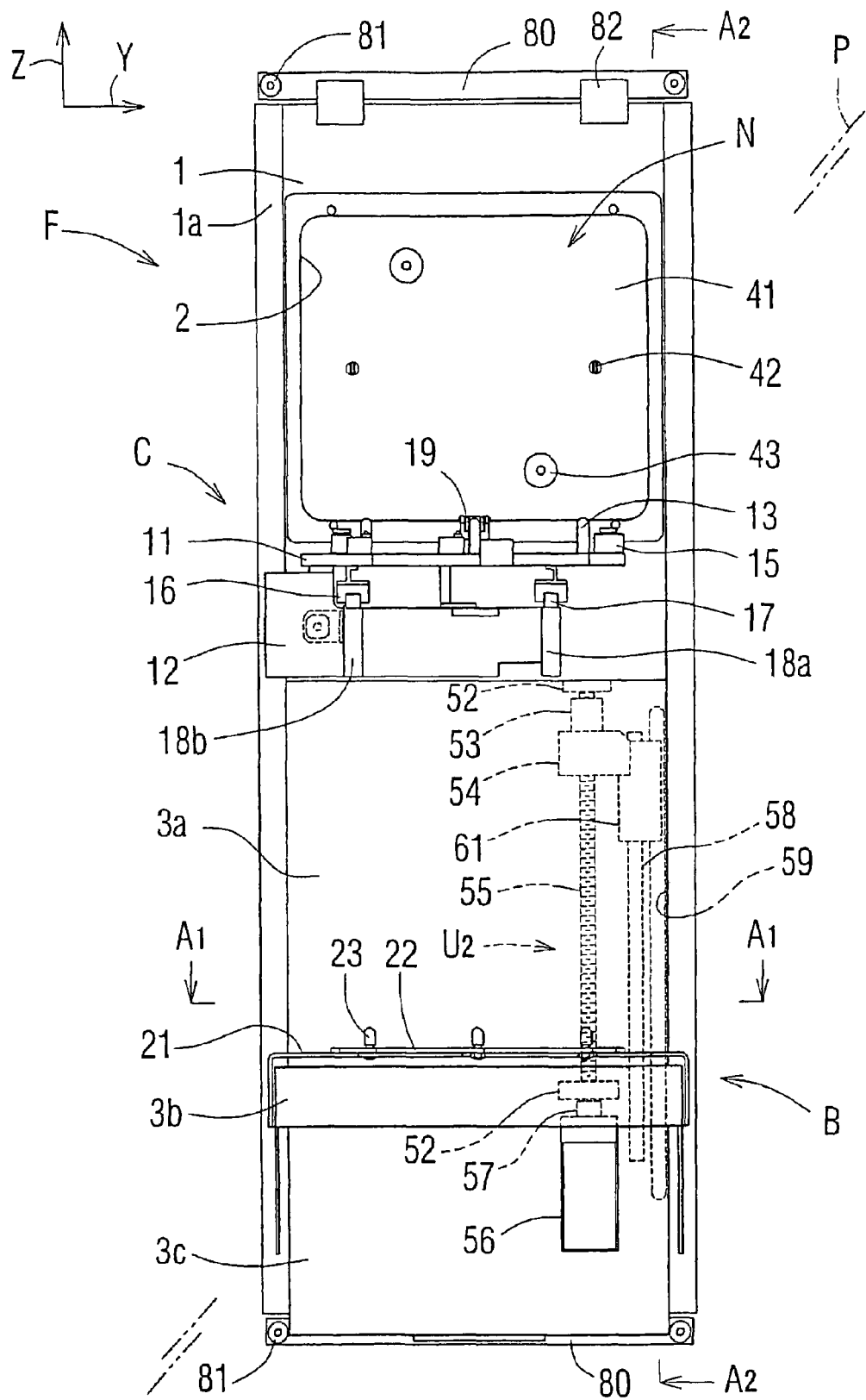
FIG. 2 is a front view illustrating the load port device F.
Figure 3:
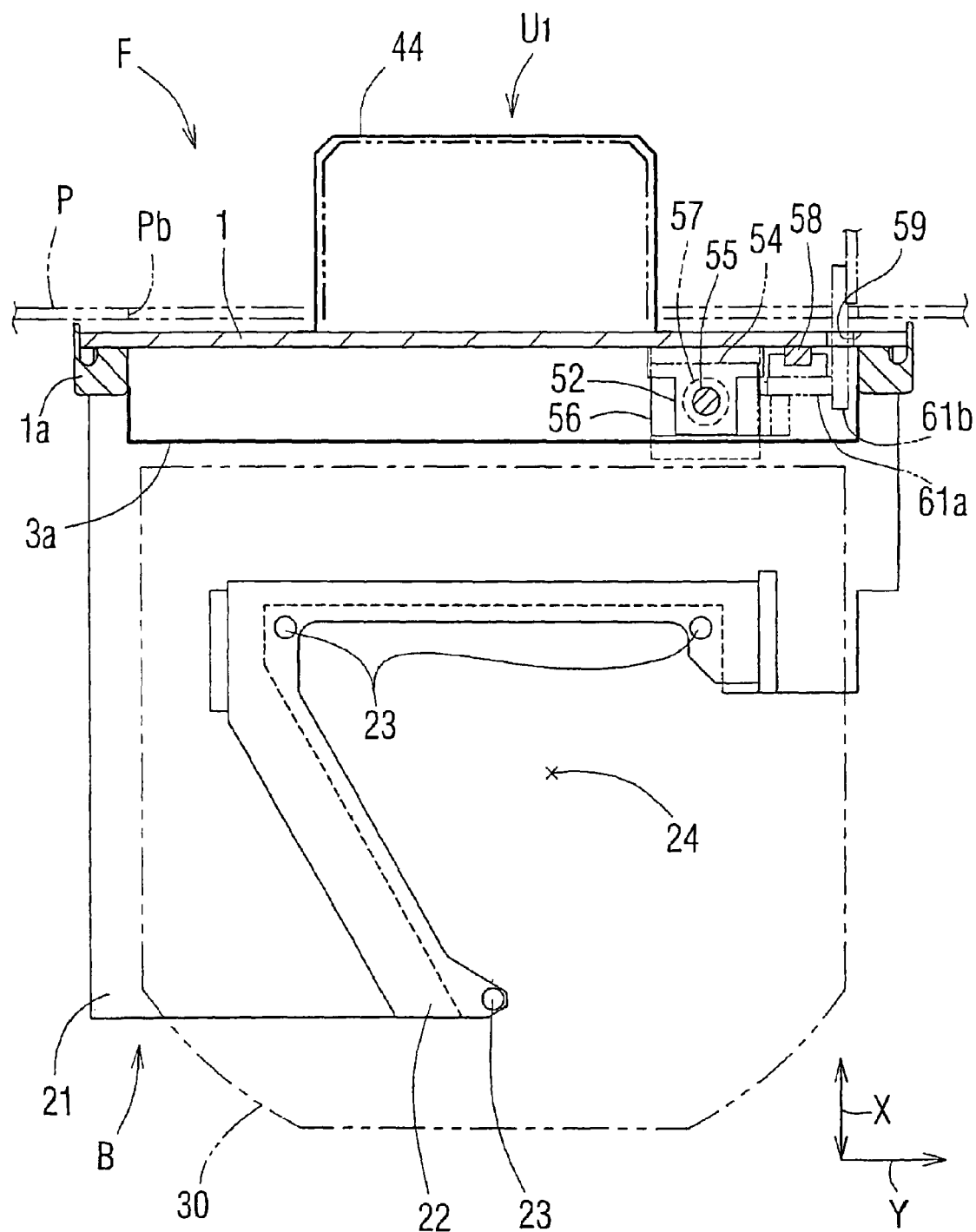
FIG. 3 is a sectional view illustrating the load port device F taken along Line A1-A1 in FIG. 2.
Figure 4:
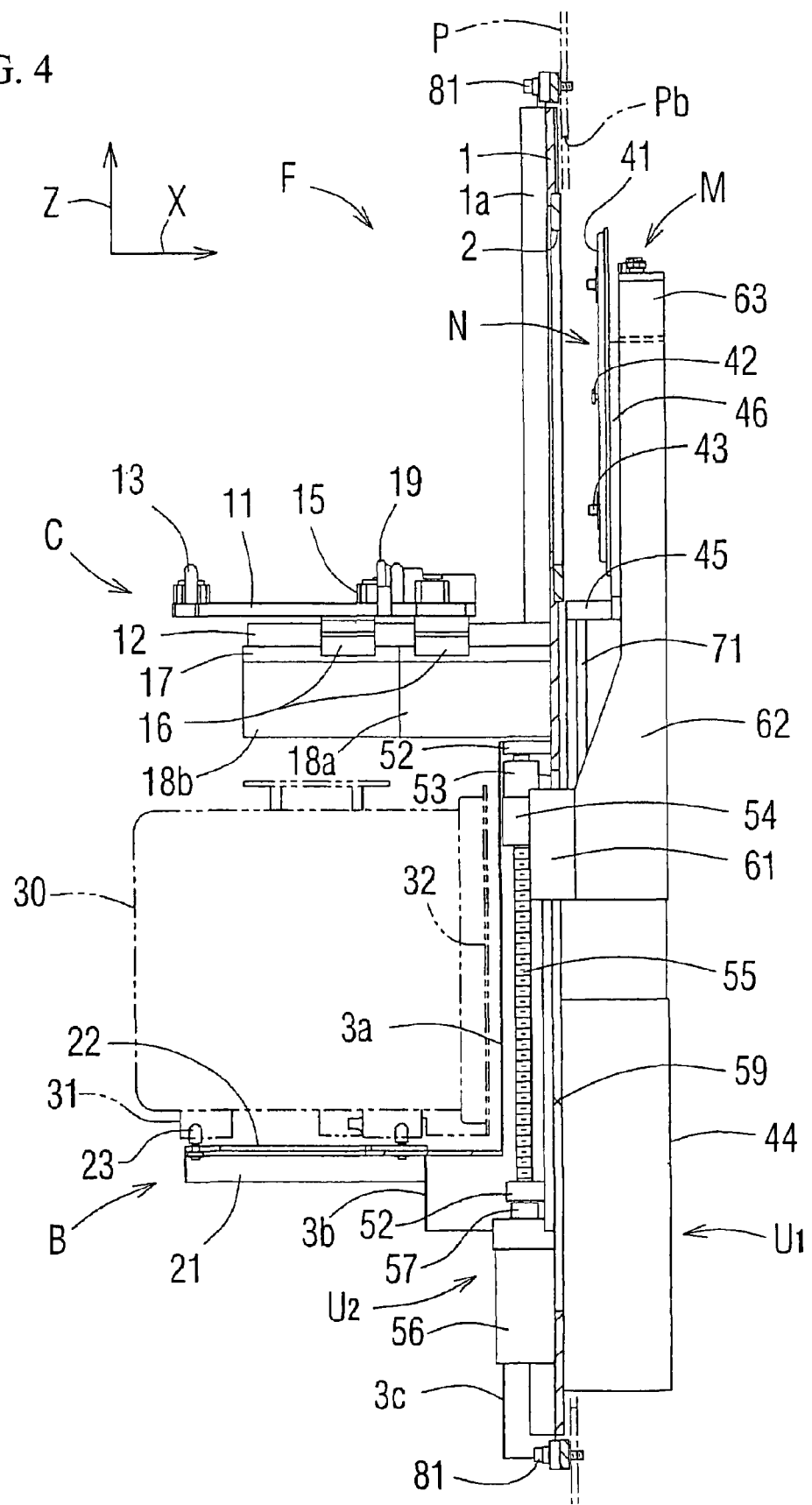
FIG. 4 is a sectional view illustrating the load port device F taken along Line A2-A2 in FIG. 2.

First, a configuration of a load port device F according to the invention will be described with reference to FIGS. 1 to 4. The load port device F is an internal load port mounted in front of a wall member P isolating a stockyard R1 from an enclosure R2 that is a front chamber of a processing device R3. The load port device F will be described separately from an external load port L. FIG. 1 is an overall perspective view illustrating a load port device F. FIG. 2 is a front view illustrating the load port device F. FIG. 3 is a sectional view illustrating the load port device F taken along Line A1-A1 in FIG. 2. FIG. 4 is a sectional view illustrating the load port device F taken along Line A2-A2 in FIG. 2. As shown in FIG. 1, the load port device F includes a mount base 1 with a thick rectangular plate shape, a transfer window 2 formed on an upper part of the mount base 1, a carrier stage C disposed in reciprocation directions X (hereinafter, referred to as "direction X") of a carrier plate 11 to and from a processing device R3 in a lower edge of the wafer transfer window 2, and a buffer stage B formed so as to protrude to the front side thereof below a table 18 of the carrier stage C. In a front side of the load port device F, an elevation mechanism U2 of a mapping device M and a cover 3 covering the elevation mechanism U2 are disposed. In a rear side of the load port device F, a cover opening/closing unit N, an elevation mechanism U1, and the mapping device M are disposed. A lower space of the carrier stage C is a space used to place a carrier on the buffer stage B. Since the elevation mechanism U2 of the mapping device M protrudes from a surface of the mount base 1, the cover 3 is provided to protect the elevation mechanism U2 of the mapping device M by covering the same. The cover 3 is classified into three cover members 3a, 3b, and 3c (where it will be described in detail below). Further, in the load port device F, each attachment member 80 is fixed to an upper end and a lower end of the mount base 1 by the use of an installation assisting piece 82. Then, the load port device F is configured so as to be mounted on a wall member P as below. After the load port device F is fitted into a load port device space Pb formed on a wall member P, both ends of each of the attachment members 80 in a transverse direction Y (hereinafter, referred to as "a direction Y") are fixed to the wall member P by the use of a bolt 81 or the like.

As shown in FIGS. 1 and 2, the carrier stage C includes a carrier plate 11, a table 18 formed on the lower edge of the wafer transfer window 2 and constituted by a pair of plate support members 18a and 18b with a different length formed in parallel to the front side of the mount base 1, a pair of guides 16 and a pair of guide rails 17 formed so as to slide in the X direction, and a slide drive unit 12. A pair of guide rails 17 are laid down in the X direction of the table 18 and the guide 16 is mounted on the guide rail 17. In the embodiment, the slide drive unit 12 is attached to one side surface of the support 18b disposed on one side of the table 18. In the carrier plate 11, a movable region part (in the embodiment, a front side of a front right side) of a transfer arm 71 is cut out so as not to allow the transfer arm 71 of a carrier transfer device T1 to interfere with the carrier stage C. For this reason, in the table 18 supporting the carrier plate 11, the plate support member 18a on the movable region side is configured to be shorter in size than the plate support member 18b on the other side. Further, in the carrier plate 11, a hand insertion space 14 with a triangular shape is formed at the substantial center of the carrier plate 11 so as to insert a transfer hand 72 with a triangular shape of the carrier transfer device T1 therein. Positioning pins 13 fitted into positioning pedestals 31 formed on positions corresponding to three apexes with a triangular shape on a bottom surface of the carrier 30 and a seating sensor 15 for detecting whether the carrier 30 is placed is attached to a circumference of the carrier plate 11 forming the hand insertion space 14 so as to correspond to three apexes of the hand insertion space 14 with a triangular shape. Additionally, reference numeral 19 is a locker for securely maintaining the carrier 30 in its positioned state.

Figure 8:
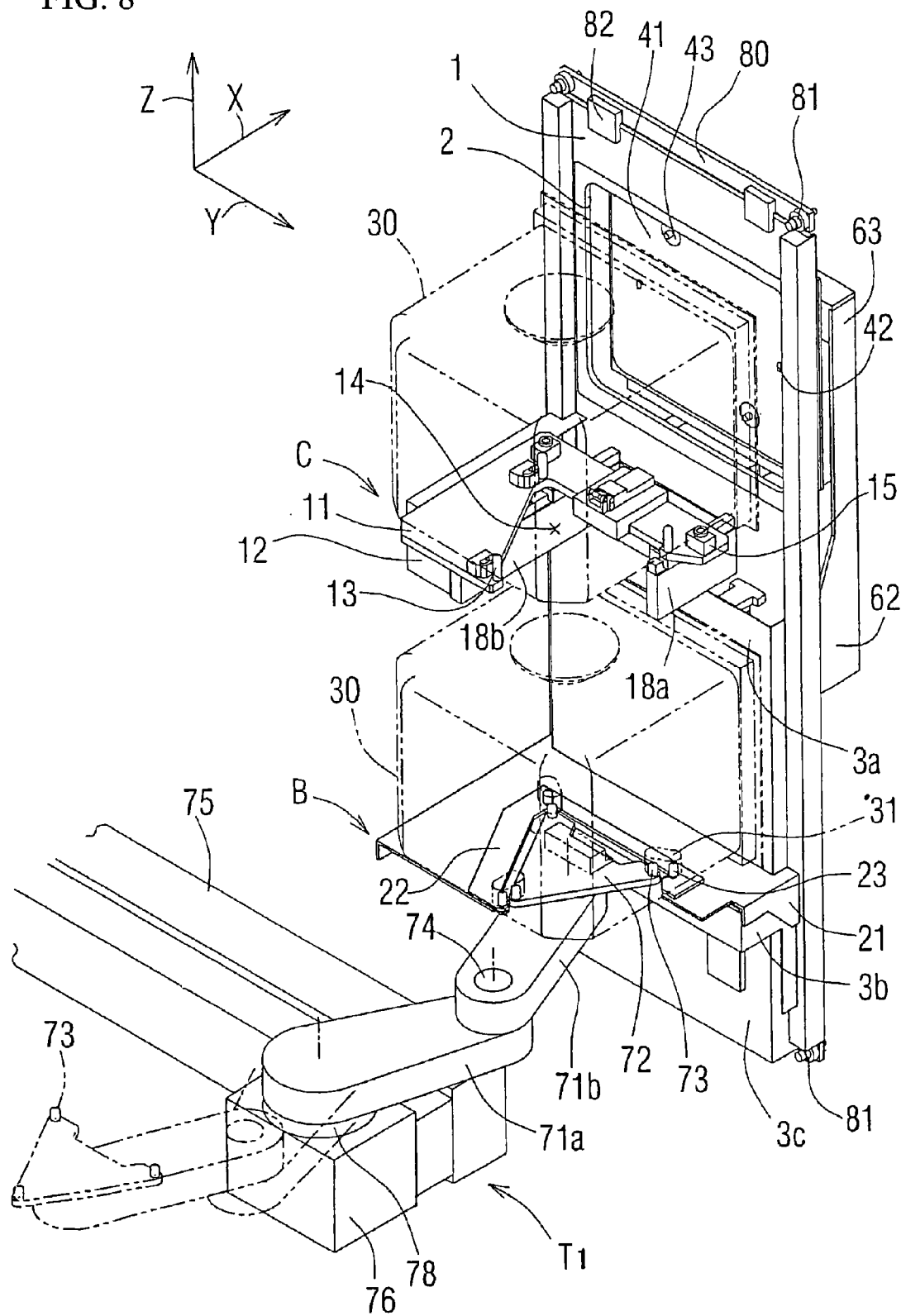
FIG. 8 is a perspective view illustrating the load port device F in the state where a carrier 30 is placed on a buffer plate 21 of a buffer stage B by a carrier transfer device T1.
Figure 9:
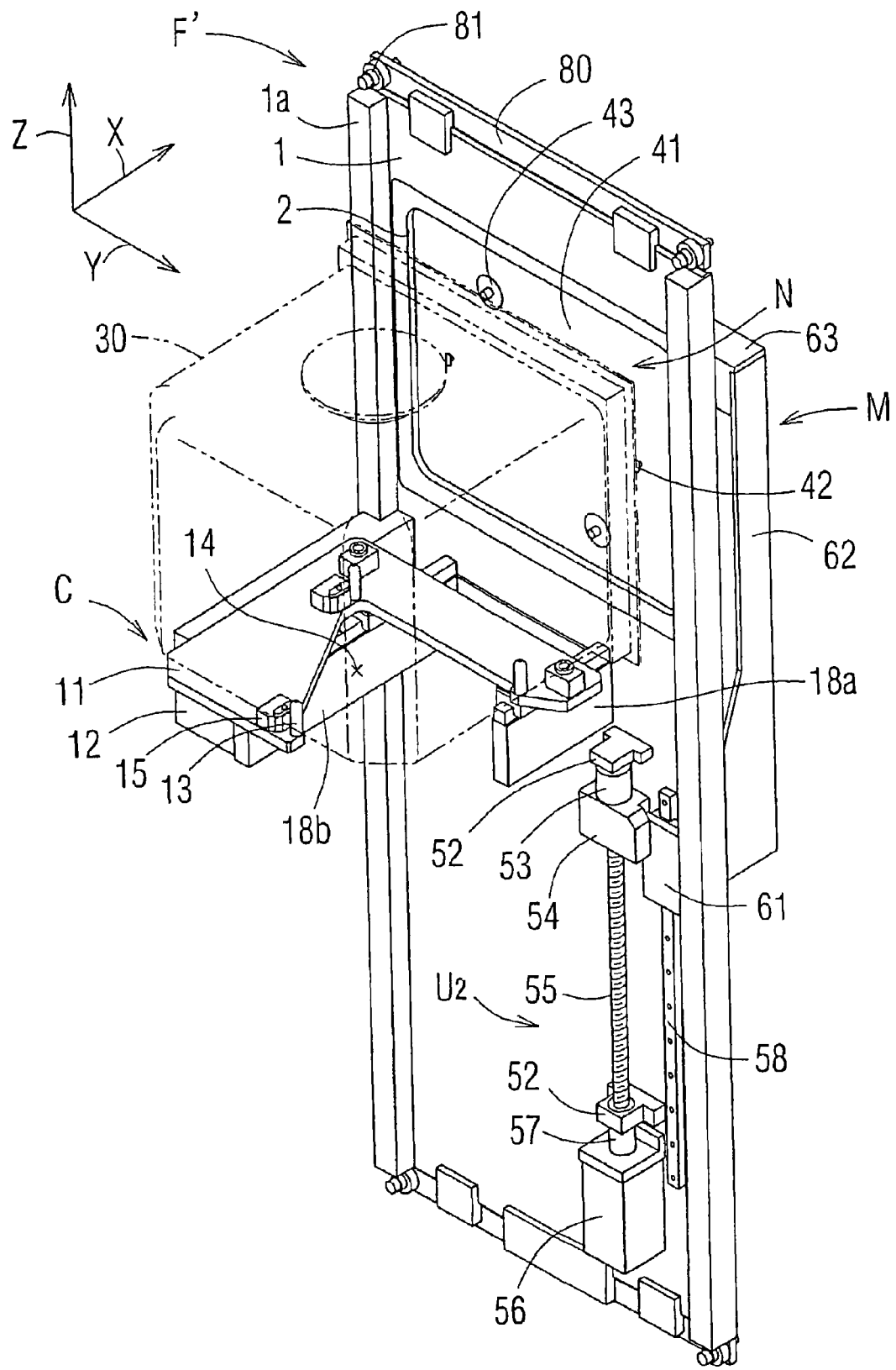
FIG. 9 is an overall perspective view illustrating a related-art load port device F'.

The buffer stage B will be described with reference to FIGS. 1, 3, and 8. FIG. 8 is a perspective view illustrating the load port device F in the state where the carrier 30 is placed on a buffer plate 21 of the buffer stage B by the carrier transfer device T1. The buffer stage B includes the buffer plate 21, a strengthening plate 22, and positioning pins 23. The buffer plate 21 is formed in a shape in which a thin plate with a substantial rectangular shape and a pair of side walls erecting from the side end to the lower side are included. The buffer plate 21 is fixed thereto so as to be connected to the lower end of the cover member 3a and a support member 1a, and covers an upper part of the cover member 3b. The upper surface of the buffer plate 21 is similar in shape to the carrier plate 11 of the carrier stage C. A hand insertion space 24 with a substantial triangular shape to which the transfer hand 72 with a triangular shape of the carrier transfer device T1 is inserted is formed thereon. Further, when the carrier transfer device T1 places the carrier 30 on the buffer plate 21, a movable region part (in the embodiment, a front side of the front right side) of the transfer arm 71 on the buffer plate 21 is cut out so as not to allow the transfer arm 71 to interfere with the buffer plate 21. The strengthening plate 22 formed of a thin plate with a predetermined width is attached to a circumference of the buffer plate 21 forming the hand insertion space 24 so as to enclose the circumference of the buffer plate 21 at a predetermined width. The positioning pins 23 fitted to the positioning pedestals 31 on the bottom surface of the carrier 30 are fixed to the circumference of the buffer plate 21 through the strengthening plate 22 so as to correspond to three apexes of the hand insertion space 24 with a triangular shape, which is the same configuration as the positioning pins 13 on the carrier plate 11. The positioning pins 23 of the buffer plate 21 and the hand insertion space 24 have the same configuration as the positioning pins 13 on the carrier plate 11 and the hand insertion space 14. When the carrier plate 11 is at a maximum recession position from the wafer transfer window 2, on an XY plane (in a top view), the positioning pins 23 and the hand insertion space 24 are disposed at the same positions as the positioning pins 13 of the carrier plate 11 and the hand insertion space 14.

A shape of the hand insertion space 24 of the buffer plate 21 does not necessarily correspond to that of the transfer hand 72 of the carrier transfer device T1 as long as the transfer hand 72 does not interfere with the buffer plate 21. However, the transfer hand 72 mounted with the carrier 30 may be inserted in the hand insertion space 24 when the shapes do not correspond with each other. Accordingly, it is necessary to take a relationship between a shape of the hand insertion space 24 and an arrangement of the positioning pins 23 into consideration so that a position of the carrier 30 does not change on the XY plane (in a top view) when the carrier 30 is locked thereto by the positioning pins 23 and when the carrier 30 inserted in the hand insertion space 14 of the carrier plate 11 is locked thereto by the positioning pins 13.

The cover opening/closing unit N and the elevation mechanism U1 will be described with reference to FIGS. 2 to 4. As shown in FIG. 4, the cover opening/closing unit N is disposed on the rear side of the load port device F. The lower end of a main body 41 constituting the cover opening/closing unit N is guided by a guide rail 45 and thereby allowed to reciprocate in the X direction. As shown in FIGS. 2 and 4, a locking claw mechanism 42 and a sucking disk mechanism 43 are provided on a front side (one side corresponding to the rear side of the mount base 1) of the main body 41 so as to attach or detach the cover 32 of the carrier 30. A driving motor, a mechanical mechanism, and the like for moving the cover opening/closing unit N in the X direction and for attaching or detaching the cover 32 are accommodated in a box member 46 attached to the rear side of the main body 41. In addition, as shown in FIGS. 3 and 4, the elevation mechanism U1 of the cover opening/closing unit N is installed at the center of the lower end of the cover opening/closing unit N on the rear side of the mount base 1 and accommodated in a cover 44.

Next, the mapping device M and the elevation mechanism U2 thereof will be described with reference to FIGS. 2 to 4. As shown in FIG. 2, the elevation mechanism U2 includes the following members. That is, the elevation mechanism U2 includes a ball screw 55 disposed on the lower part (in the embodiment, the lower part of a front right side) of one side of the carrier stage C, brackets 52 rotatably supporting the upper end and the lower end of the ball screw 55, a stepping motor 56 connected to the lower end of the ball screw 55 through a coupling 57, a nut member 53 elevating along the ball screw 55 when the ball screw 55 rotates by operating the stepping motor 56, a connection member 54 connecting the nut member 53 to a guide 61, and a guide rail 58 guiding an elevation of the guide 61 with the nut member 53 elevating. An opening 59 that is parallel to the guide rail is formed on the mount base 1 so as to be positioned between the guide rail 58 and the support member 1a. As shown in FIG. 3, a sectional view of the guide 61 is a substantial L shape in which a member 61a is perpendicular to a member 61b. The member 61b is inserted into the opening 59 and then a portion of the member 61b protruding to the rear side of the mount base 1 is connected to the mapping frame 62. Further, the member 61a on the front side of the mount base 1 is connected to the connection member 54. Since the elevation mechanism U2 has the above-described configuration, the elevation mechanism U2 does not largely protrude to the front side of the mount base 1. Accordingly, a space for placing the carrier 30 thereon is formed below the carrier stage C. As shown in FIG. 4, the mapping device M includes a mapping mechanism (not shown), a mapping frame 62, and a mapping head 63. The mapping head 63 is attached to the upper end of the mapping frame 62 so as to have a cantilever shape in a Y direction. The mapping mechanism is disposed on the mapping head 63. The mapping head 63 is disposed just above the box member 46 of the cover opening/closing unit N.

The cover 3 has a shape in which side walls erects by a predetermined length from both side ends of a thin plate with a rectangular shape and covers the mount base 1 below the table 18 of the carrier base C. The cover 3 includes three members, that is, the cover member 3a covering a part from a position right below the table 18 of the carrier stage C to a position of an upper surface of the buffer plate 21 of the buffer stage B, the cover member 3b covering a part right below the buffer plate 21 of the buffer stage B as many as a predetermined length, and the cover member 3c covering a part from a position of the lower end of the cover member 3b to a position of the lower end of the mount base 1 when viewed from the front side of the mount base 1. A height (that is, a length in the X direction from the mount base 1 to the cover member 3a) of the cover member 3a is designed so as not to allow the cover member 3a to interfere with any one of the elevation mechanism U2 of the mapping device M and the cover 32 placed on the buffer plate 21. For this reason, the carrier 30 is prevented from interfering with the elevation mechanism U2 due to a malfunction or the like of the carrier transfer device T1. As a result, it is possible to protect the carrier 30 and the elevation mechanism U2. A height (that is, a length in the X direction from the mount base 1 to the cover member 3b) of the cover member 3b is designed so as not to allow the cover member 3b to interfere with the stepping motor 56 of the elevation mechanism U2. Since the height of the cover member 3b is larger than that of the cover member 3a, the cover member 3b is formed so as to protrude to the front side more than the cover member 3a. For this reason, the cover member 3b having the above-described shape can upwardly support an installation part of the buffer plate 21 on the mount base 1. As a result, the buffer plate 21 can be effectively strengthened. A height of the cover member 3c can be freely designed. However, a height of the cover member 3c is substantially set to be large so as not to allow the cover member 3c to interfere with the stepping motor 56 of the elevation mechanism U2. Alternatively, in consideration of a heat from the stepping motor 56 at the time of an operation of thereof, a part corresponding to the stepping motor 56 is cut out and then the stepping motor 56 is allowed to protrude from the cover member 3c so as not to allow the cover member 3c to interfere with the stepping motor 56. In the cover member 3c according to the embodiment, the height of the cover member 3c is the same as that of the cover member 3a, but formed in a protruding shape in which the stepping motor 56 protrudes from the cover member 3c by cutting out the cover member 3c along the shape of the stepping motor 56.

Figure 5:
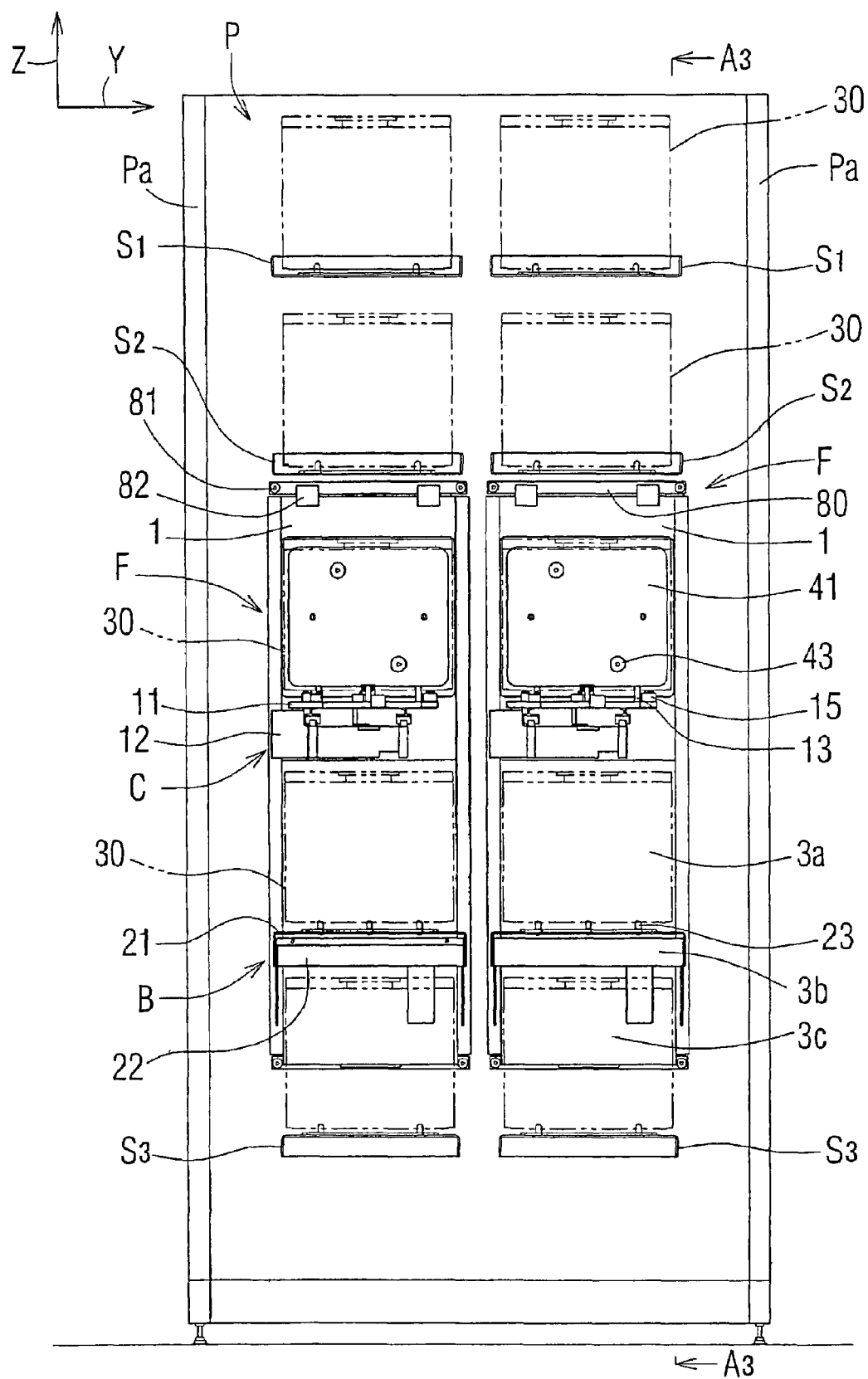
FIG. 5 is a view illustrating a front side of the load port device F mounted on a wall member P and a shelf S on which a carrier is mounted.
Figure 6:
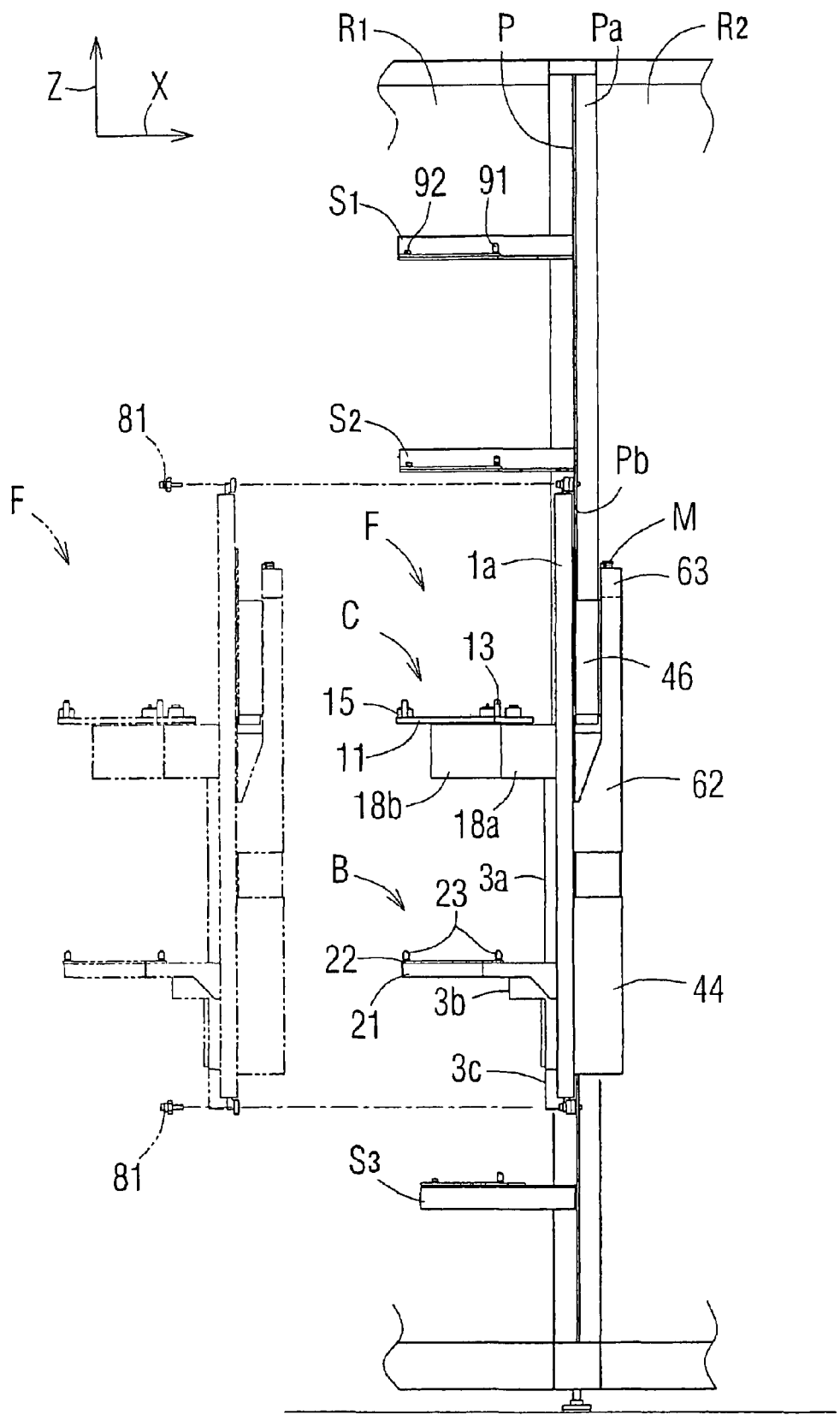
FIG. 6 is a sectional view illustrating the load port device F taken along Line A3-A3 in FIG. 5.

Next, a fabrication apparatus on which the load port device F is installed will be described with reference to FIGS. 4 to 7. FIG. 5 is a view illustrating a front side of the load port device F mounted on the wall member P and a shelf S on which the carrier is placed. FIG. 6 is a sectional view illustrating the load port device F taken along Line A3-A3 in FIG. 5. The load port device F is disposed so as to allow a protruding direction of the carrier stage C to be disposed in the stockyard R1. The load port device F is fitted to a load port mount space Pb formed on the wall member P isolating the stockyard R1 from the enclosure R2 and fixed to the wall member P by the use of the bolt 81 or the like. That is, the front side of the load port device F is disposed on the side of the stockyard R1 and the rear side thereof is disposed on the side of the enclosure R2. One or more of the load port devices F are attached to the wall member P depending on a size of the fabrication apparatus in the Y direction. In the embodiment, as shown in FIG. 5, two load port devices F are installed. Further, in the related-art fabrication apparatus, the same number of the external load ports L as the load port devices F are provided. The carrier transferring operation from the external load port L to the carrier stage C of the load port device F is carried out in the same line as a reciprocation direction X relative to the processing device R3. In the drawings, Pa denotes a frame of the fabrication apparatus.

The carrier installation shelf S disposed in the stockyard R1 will be described with reference to FIGS. 5 and 6. The carrier installation shelf S is a shelf for placing the carrier 30 thereon when the carrier 30 placed on the external load port L is received in the stockyard R1. The carrier installation shelf S is attached to the wall member P. Each of the carrier installation shelves S is installed at a predetermined interval on each of the upper part and the lower part of the load port device F attached to the wall member P within a height of the fabrication apparatus. In the carrier installation shelf S according to the embodiment, two carrier installation shelves S are provided on the upper part of each of the two load port device F and one carrier installation shelf S is provided on the lower part thereof while being attached to the wall member P. The carrier installation shelves S installed in each row thereof are sequentially denoted by S1, S2, and S3 from the top thereof. In each of carrier installation shelves S1, S2, and S3, positioning pins 91 for locking the carrier 30 fitted to the positioning pedestals 31 and a hand insertion space (not shown) are formed. In the load port device F and the carrier installation shelves S1, S2, and S3 disposed in the same row, when the carrier mounted on the transfer hand 72 of the carrier transfer device T1 is placed onto any one of the carrier installation shelves S1, S2, and S3 by the positioning pins 91 after insertion into the hand insertion space, a position of the carrier on the XY plane (in a top view) corresponds to a position where the carrier is placed on the carrier plate 11 when the carrier plate 11 is at a maximum recession position from the wafer transfer window 2. In addition, a seating pin 92 is formed on each of the carrier installation shelves S1, S2, and S3. When the carrier 30 is placed on the carrier installation shelf S, the bottom surface of the carrier 30 is allowed to come in contact with the seating pin 92. As a result, stability of the carrier 30 placed thereon is ensured.

The carrier transfer device T1 will be described with reference to FIG. 8. The carrier transfer device T1 is disposed in the stockyard R1. The carrier transfer device T1 includes an elevation mechanism 77 fixed to an inner surface of one side wall of the stockyard R1 and disposed in a Z direction of a height of the fabrication apparatus, a rail 75 having one end fixed to the elevation mechanism 77 and disposed in the Y direction, a horizontal movement mechanism 76 fixed to the rail 75 and sliding on the rail 75, the transfer arm 71 rotatably fixed to the horizontal movement mechanism 76, and the transfer hand 72 rotatably attached to a front end of the transfer arm 71. The transfer arm 71 includes a unit 71a and a unit 71b. One end of the unit 71a is fixed to the horizontal movement mechanism 76 so as to rotate by the use of a rotation shaft 78 and the other end thereof is connected to one end of the unit 71b through a rotation shaft 74. The other end of the unit 71b is connected to the transfer hand 72. Each locking pin 73 is attached to each apex on the transfer hand 72 with a triangular shape. The locking pins 73 on three positions are disposed so as to correspond to the positioning pedestals on three positions that are disposed on three apexes with a triangular shape on the bottom surface of the carrier 30.

Figure 7:
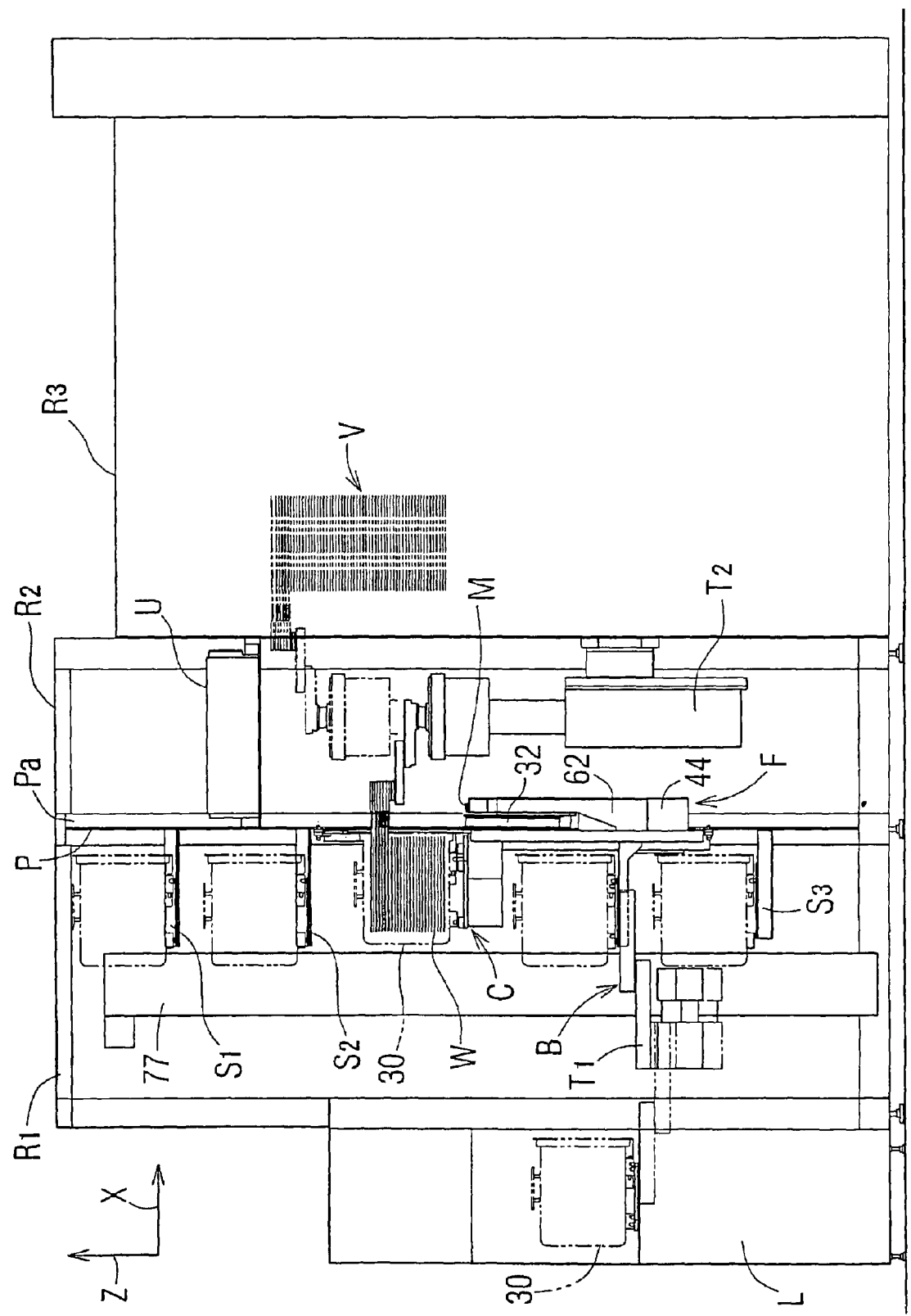
FIG. 7 is a longitudinal sectional view illustrating a fabrication apparatus.

Next, a procedure when transferring the carrier 30 that is conveyed to the fabrication apparatus and then temporarily stored in the buffer stage B to the carrier stage C with reference to FIGS. 7 and 8. In the embodiment, two load port devices F are installed, but focusing on one of them, a transferring operation from the external load port L that is disposed on the same line in the X direction of the load port device F to the load port device F will be described. First, the carrier 30 conveyed from the fabrication apparatus is received in the external load port L attached to a front side of the fabrication apparatus so as to allow the cover 32 of the carrier 30 to face an entrance of the fabrication apparatus. The rail 75 fitted to the horizontal movement mechanism 76 is elevated and then stopped at a predetermined height by the elevation mechanism 77 constituting the carrier transfer device T1. Subsequently, the horizontal movement mechanism 76 slides on the rail 75 in the Y direction and then stopped at a position of the external load port L. The transfer arm 71 lengthens by rotating each of the unit 71a, the unit 71b, and the transfer hand 72 so as to insert the transfer hand 72 below the bottom surface of the carrier 30 placed on the external load port L. The transfer arm 71 and the transfer hand 72 are slightly lifted up so as to fit the locking pins 73 of the transfer hand 72 to the positioning pedestals 31 at three positions on the bottom surface of the carrier 30. Subsequently, the transfer arm 71 is slightly lifted up so as to securely support the lower part of the carrier 30 by the use of the transfer hand 72. Subsequently, the transfer arm 71 shortens by rotating each of the unit 71a, the unit 71b, and the transfer hand 72 so as to recede from the external load port L. Subsequently, the transfer arm 71 lengthens by rotating each of the unit 71a, the unit 71b, and the transfer hand 72 so as to allow the carrier 30 to move in the X direction to the buffer stage B of the load port device F while the cover 32 of the carrier 30 faces the front side. At this time, three dimensional (XYZ) direction positions of the horizontal movement mechanism 76 should be fixed. Subsequently, the lengthened transfer arm 71 inserts the transfer hand 72 supporting the carrier 30 slightly above the hand insertion space 24 of the buffer plate 21. The transfer arm 71 is slightly lifted down so as to fit the positioning pins 23 of the buffer plate 21 to the positioning pedestals 31 on the bottom surface of the carrier 30. At this time, in the grooves formed on the positioning pedestals 31, the locking pins 73 of the transfer hand 72 are fitted into the inside of the grooves and the positioning pins 23 of the buffer plate 21 are fitted into the outside of the grooves so as not to interfere with each other. Subsequently, when the transfer arm 71 is lifted down so as to completely detach the locking pins 73 of the transfer hand 72 from the positioning pedestals 31, the carrier 30 is placed on the buffer plate 21 in the state where the positioning pins 23 are fitted to the positioning pedestals 31. Finally, the transfer arm 71 shortens by rotating each of the unit 71a, the unit 71b, and the transfer hand 72 so as to allow the transfer hand 72 to recede from the hand insertion space 24.

Next, a procedure when transferring the carrier 30 placed on the buffer plate 21 onto the carrier plate 11 of the carrier stage C will be described. First, the transfer arm 71 moves from a present position of the transfer arm 71 of the carrier transfer device T1 to the front side of the carrier 30 by operating the elevation mechanism 77 and the horizontal movement mechanism 76. The transfer arm 71 lengthens by rotating each of the unit 71a, the unit 71b, and the transfer hand 72. The transfer hand 72 is inserted into the hand insertion space 24 of the buffer plate 21 so as to be positioned slightly lower than the buffer plate 21. Subsequently, the locking pins 73 of the transfer hand 72 are fitted into the positioning pedestals 31 on the bottom surface of the carrier 30 by slightly lifting up the transfer hand 72. At this time, in the grooves of the positioning pedestals 31, the locking pins 73 are fitted into the inside of the grooves and the positioning pins 23 of the buffer plate 21 are fitted into the outside of the grooves so as not to interfere with each other. Subsequently, the positioning pins 23 are completely detached from the positioning pedestals 31 by slightly lifting up the transfer hand 72, so that the lower part of the carrier 30 is completely supported by the transfer hand 72. The transfer arm 71 shortens by rotating each of the unit 71a, the unit 71b, and the transfer hand 72 and allows the carrier 30 to move backward in the X direction so as to completely recede from the buffer stage B.

Subsequently, the elevation mechanism 77 lifts up the rail 75 so as to reach the height of the carrier plate 11 of the carrier stage C, and then lifts up the transfer arm 71. At this time, the carrier plate 11 slides to a maximum recession position from the wafer transfer window 2 by the slide mechanism 12. Subsequently, the transfer arm 71 lengthens by rotating each of the unit 71a, the unit 71b, and the transfer hand 72, and allows the carrier 30 to move forward in the X direction, so that the transfer hand 72 supporting the carrier 30 is inserted into the hand insertion space 14 of the carrier plate 11 so as to be slightly higher than the plate 11. The transfer hand 72 is allowed to slightly move down so that the positioning pins 13 on the carrier plate 11 are fitted into the positioning pedestals 31 on the bottom surface of the carrier 30. At this time, in the grooves of the positioning pedestals 31, the locking pins 73 of the transfer hand 72 are fitted into the inside of the grooves and the positioning pins 13 are fitted into the outside of the grooves so as not to interfere with each other. When the transfer hand 72 is lifted down, the positioning pins 13 are securely fitted into the positioning pedestals 31 and the locking pins 73 of the transfer hand 72 are detached from the positioning pedestals 31. Accordingly, the carrier 30 is placed on the carrier plate 11 so as to insert the positioning pins 13 into the positioning pedestals 31. Finally, as the transfer arm 71 shortens by rotating each of the unit 71a, the unit 71b, and the transfer hand 72, the transfer hand 72 thereby recedes in the X direction. The carrier plate 11 on which the carrier 30 is placed moves toward the wafer transfer window 2 until the cover 32 of the carrier 30 comes in contact with the wafer window 2 by means of the slide mechanism 12.

The above-described procedure is the same as a procedure when transferring the carrier 30 from the external load port L to the carrier installation shelves S1, S2, and S3. Accordingly, when the carrier 30 conveyed to the external load port L is stored in the stockyard R1, in each load port device F, one additional space for placing the carrier 30 thereon increases in addition to the carrier installation shelves S1, S2, and S3 by attaching the buffer stage B to the load port device F. For this reason, a reception capacity of the carrier in the limited space of the stockyard R1 increases. Additionally, in the load port device F, the buffer stage B is formed right below the table 18 of the carrier stage C. As a result, a distance when transferring the carrier 30 from the buffer plate 21 of the buffer stage B to the carrier plate 11 of the carrier stage C is shorter than that when transferring from the carrier installation shelves S1, S2, and S3 in the stockyard R1. Further, a height of the external load port L is almost the same as that of the buffer plate 21. Accordingly, when the buffer stage B in the stockyard R1 is empty and the carrier 30 is transferred from the external load port L, a carrier moving distance when transferring the carrier 30 to the buffer stage B is shorter than that when transferring the carrier 30 to the carrier installation shelves S1, S2, and S3. As a result, work efficiency is improved.

When the carrier 30 is placed on the carrier plate 11 and then the carrier 30 moves forward to a position of coming in contact with the wafer transfer window 2, the processing device R3 performs a wafer processing to the wafer W housed in the carrier 30 according to the known procedure. That is, a cover of the carrier 30 is first opened by an operation of the cover opening/closing unit N, and then the cover opening/closing unit N and the cover 32 are lifted down by the elevation mechanism U1. Subsequently, the mapping device M is lifted down by the elevation mechanism U2 while detecting the wafer W housed in the carrier 30 in a form of multi stairs. After the detection, the wafer W is taken out by the wafer transfer robot T2 and then conveyed to the processing device R3 to be processed. The plurality of sheets of the wafer W conveyed to the processing device R3 is received in a wafer board V in a form of multi stairs and the wafer W is subjected to a chemical process every wafer board V. When the process ends, the wafer transfer robot T2 returns a processed wafer W' received in the wafer board V to the carrier 30 to be housed therein. Subsequently, the mapping device M is lifted up while detecting the wafer W' housed in the carrier 30. After the detection, the cover 32 of the carrier 32 that is lifted down along with the cover opening/closing unit N is lifted up so as to be attached to the opening of the carrier 30. Subsequently, the carrier plate 11 slides from the wafer transfer window 2 and thereby the carrier 30 recedes from the wafer transfer window 2.

When the carrier 30 recedes from the wafer transfer window 2 in the X direction and reaches the maximum recession position, the carrier 30 is transferred from the carrier plate 11 to the external load port L by the carrier transfer device T1 or the carrier 30 is temporarily stored in the buffer plate 21 of the buffer stage B or the carrier installation shelf S and then transferred to the external load port L. The carrier 30 transferred to the external load port L is conveyed from the fabrication apparatus to proceed to the next process by the carrier conveyance system. When the carrier 30 is temporarily stored in the buffer stage B from the carrier stage C and then transferred to the external load port L, it may take a reverse procedure that is totally different from the above-described procedure in which the carrier 30 is transferred from the external load port L to the buffer stage B and then the carrier stage C.

The buffer stage B according to the invention is attached to the load port device F, but may be attached to the external load port L. Accordingly, a storage space of the carrier 30 is provided even in the outside of the fabrication apparatus. Therefore, a high reception capacity of the carrier 30 can be effectively ensured in the clean room.

What is claimed is:

1. A load port device comprising:
   a mount base adapted to be fixed to a partition wall which is disposed between a stockyard for temporarily storing a wafer carrier which houses a wafer and a wafer processing device for processing the wafer;
   a wafer transfer window provided on the mount base;
   a carrier stage having:
   a table horizontally extended from a lower edge of the wafer transfer window; and
   a carrier plate disposed on the table so as to support the wafer carrier and movable so as to transfer the wafer carrier to the processing device;
   a carrier transfer device, which is disposed within the stockyard, for transferring the wafer carrier by supporting the wafer carrier so as to attach and detach the wafer carrier to and from the carrier plate; and
   a buffer stage having a buffer plate horizontally disposed below the table so as to temporarily store the wafer carrier,
   wherein the buffer plate is disposed substantially at the same height with an external load port which is placed outside the stockyard on a side of the stockyard located opposite to the wafer processing device, such that when the buffer stage in the stockyard is empty and the wafer carrier is transferred from the external load port by the carrier transfer device, a wafer carrier moving distance when transferring the wafer carrier to the buffer stage is shorter than that when transferring the wafer carrier to a plurality of wafer carrier installation shelves disposed within the stockyard.

2. The load port device as set forth in claim 1, wherein:
   the carrier plate is movable between a first position and a second position which is nearer to the wafer transfer window than the first position;
   the carrier plate is provided with a plurality of first positioning pins operable to position the wafer carrier relative to the carrier plate and a first hand insertion space so as to prevent interference with a transfer hand of the carrier transfer device for transferring the wafer carrier by supporting the wafer carrier so as to attach and detach the wafer carrier to and from the carrier plate;
   the buffer plate is provided with a plurality of second positioning pins operable to position the wafer carrier relative to the buffer plate and a second hand insertion space so as to prevent interference with the transfer hand of the carrier transfer device; and
   when the carrier plate is positioned in the first position, the first positioning pins are situated at the same position with the second positioning pins as viewed from the top and the first hand insertion space is situated at the same position with the second hand insertion space as viewed from the top.

3. The load port device as set forth in claim 1, further comprising:
   a mapping device comprising a mapping frame and a mapping head attached to an upper end of the mapping frame so as to have a cantilever shape;
   an elevator disposed below the carrier stage and operable to move the mapping device in a vertical direction; and
   a cover covering the elevator.

* * * * *